US006456490B1

(12) United States Patent
Lai

(10) Patent No.: US 6,456,490 B1
(45) Date of Patent: Sep. 24, 2002

(54) ENGAGEMENT SECURING DEVICE FOR A HEAT SINK

(75) Inventor: Yaw-Huey Lai, Hsi-Chih (TW)

(73) Assignee: Tai-Sol Electronics Co., Ltd., Hsi-Chih (TW)

( * ) Notice: Subject to any disclaimer, the term of this patent is extended or adjusted under 35 U.S.C. 154(b) by 0 days.

(21) Appl. No.: 09/923,871

(22) Filed: Aug. 6, 2001

(51) Int. Cl.⁷ .................................................. H05K 7/20
(52) U.S. Cl. ...................... 361/684; 361/704; 361/719; 257/718; 165/80.3
(58) Field of Search ............................. 361/683, 684, 361/688–690, 702–710, 737–759, 714–722; 257/706–727, 675, 686; 165/80.2, 80.3, 80.4, 185, 104.33; 174/15.1, 15.2, 16.3, 251, 252, 16.1; 403/270, 268, 265; 363/141, 144

(56) References Cited

U.S. PATENT DOCUMENTS 5,883,782 A * 3/1999 Thurston et al. ............ 361/704
6,046,905 A * 4/2000 Nelson et al. ............... 361/704

FOREIGN PATENT DOCUMENTS

JP 411163232 A * 6/1999 ........... H01L/23/36

* cited by examiner

Primary Examiner—Darren Schuberg
Assistant Examiner—Michael Datskovsky
(74) Attorney, Agent, or Firm—Jenkens & Gilchrist, P.C.

(57) ABSTRACT

An engagement securing device includes a support member disposed below a motherboard and having supporting and surrounding portions. The supporting portion is disposed closer to the motherboard than the surrounding portion. A first spacer member is disposed on the supporting portion and abuts against a lower side of the motherboard opposite to a central processing unit mounted on an upper side of the motherboard. Second spacers are disposed on the surrounding portion and abut against the lower side of the motherboard. A plurality of elongate tightening members are extended through tightening holes in the surrounding portion and tightening holes in the motherboard, and tightening holes in the heat sink.

9 Claims, 5 Drawing Sheets

ENGAGEMENT SECURING DEVICE FOR A HEAT SINK

BACKGROUND OF THE INVENTION

1. Field of the Invention

The invention relates to an engagement securing device, more particularly to an engagement securing device which ensures proper engagement between a motherboard and a central processing unit having a heat sink disposed thereon.

2. Description of the Related Art

With the fast development of computer technology, central processing units (CPU) are now operating at a very high speed, which means increased heat generation. To prevent overheating which may result in undesirable shutdown of the computer or damage to electronic parts, a heat sink is generally disposed on the central processing unit to help dissipate the heat generated thereby.

FIG. 1 shows a central processing unit 82 mounted on a motherboard 81 using the PGA (pin grid array) technique. A heat sink 83 is mounted on an upper side of the central processing unit 82 via screw bolts 86 that pass through a heat sink mounting member 85 and the motherboard 81.

Since the central processing unit 82 has pins 821 extending through and soldered in through holes 812 in the motherboard 81, even if the motherboard 81 is flexed upwardly and downwardly to a predetermined extent during a product reliability test conducted prior to delivery ex-factory or when subjected to a relatively large impact or shock in actual use, the pins 821 will not slip out of the through holes 812 so as not to affect electrical connection. However, if the motherboard 81 is formed by multiple substrate layers, the pins 821 that pass through the through holes 812 are likely to obstruct wiring and take up valuable wiring spaces on the substrate layers. Therefore, other CPU mounting techniques, such as the BGA (ball grid array) technique, have been developed.

Referring to FIGS. 2 to 4, a BGA-packaged central processing unit 92 is electrically connected to an upper surface of a motherboard 91 via arrays of tin balls 97 (best seen in FIGS. 3 and 4) disposed therebetween so as to overcome the wiring problem. However, when the motherboard 91 is subjected to a reliability test or a large impact or shock in actual use, both sides of the motherboard 91 may flex downward excessively, as shown in FIG. 3, so that lateral sides of a heat sink mounting member 95 supporting a heat sink 93 disengage from the upper surface of the motherboard 91. On the other hand, both sides of the motherboard 91 may flex upwardly so that the heat sink mounting member 95 bearing the heat sink 93 disengages from the upper surface of the motherboard 91. In either case, the electrical connection of the tin balls 97 is adversely affected, and the engagement between the heat sink 93 and the motherboard 91 is impaired.

SUMMARY OF THE INVENTION

Therefore, the main object of the present invention is to provide an engagement securing device which ensures proper engagement between a motherboard and a central processing unit having a heat sink disposed thereon.

Accordingly, the engagement securing device of the present invention helps maintain proper engagement between a motherboard and a central processing unit of a computer. The motherboard has upper and lower sides opposite to each other in an upright direction. The upper side has a mounting portion and a peripheral portion surrounding the mounting portion. The central processing unit is mounted on the mounting portion. The computer further includes a heat sink disposed on the central processing unit and spaced apart from the mounting portion in the upright direction, and a heat sink mounting member disposed to support the heat sink on the mounting portion. The engagement securing device includes a support member, a first spacer member, a plurality of first inner peripheral portions, a plurality of second inner peripheral portions, a plurality of elongate tightening members, and a plurality of second spacer members. The support member is adapted to be disposed under the motherboard, and has upper and lower surfaces. The upper surface is adapted to be spaced apart from the lower side of the motherboard in the upright direction, and has a supporting portion corresponding to the mounting portion, and a surrounding portion corresponding to the peripheral portion. The upper surface is configured so that the surrounding portion is spaced apart from the lower side of the motherboard by a first length, and so that the supporting portion is spaced apart from the lower side of the motherboard by a second length which is shorter than the first length. The surrounding portion defines a plurality of first tightening holes, each of which extends downwardly through the lower surface. The first spacer member is disposed on the supporting portion on the upper surface, and is adapted to abut against the lower side of the motherboard. The first inner peripheral portions are adapted to be formed in one of the heat sink and the heat sink mounting member. Each of the first inner peripheral portions defines a second tightening hole that is aligned with a respective one of the first tightening holes. The second inner peripheral portions are adapted to be formed in the peripheral portion. Each of the second inner peripheral portions defines a third tightening hole that extends through the upper and lower sides of the motherboard. Each of the elongate tightening members is configured to pass through a respective one of the third tightening holes, and is disposed to bring the surrounding portion to move toward a respective one of the first inner peripheral portions and a respective one of the second inner peripheral portions. The second spacer members are disposed on the upper surface at the surrounding portion. Each of the second spacer members is adapted to abut against the lower side of the motherboard around a respective one of the second inner peripheral portions so as to resist displacement of the surrounding portion toward the second inner peripheral portions, thereby maintaining the first spacer member between the supporting portion and the mounting portion.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
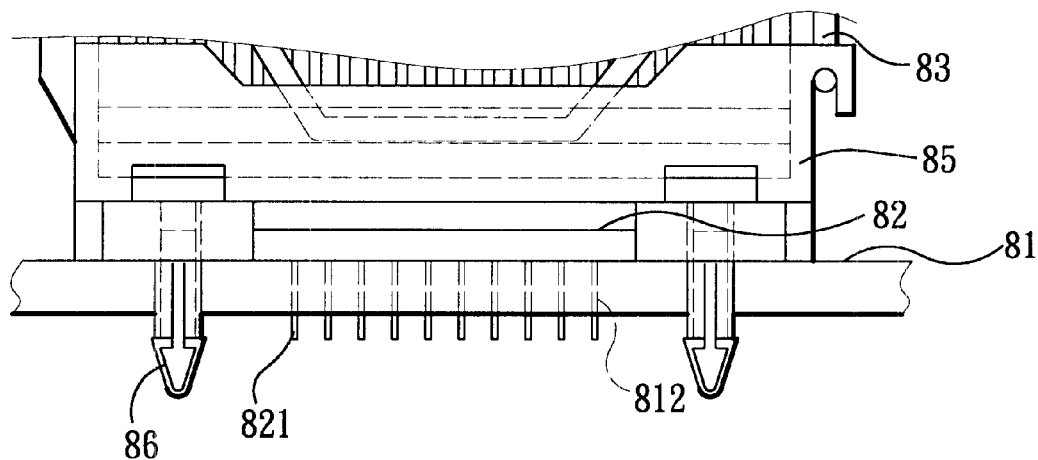
FIG. 1 is a side view illustrating a conventional structure of securing a motherboard and a central processing unit having a heat sink mounted thereon, in which the central processing unit is mounted using the PGA technique.
Figure 2:
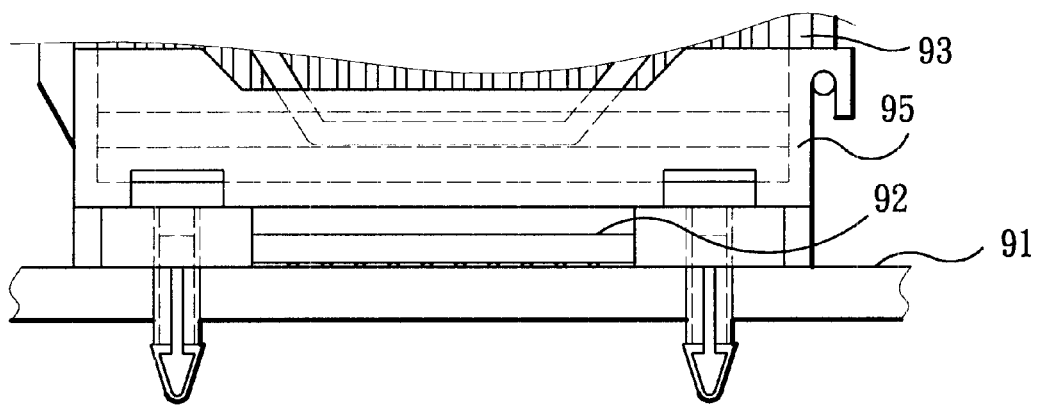
FIG. 2 is a side view similar to FIG. 2, but showing a central processing unit which is mounted using the BGA technique.
Figure 3:
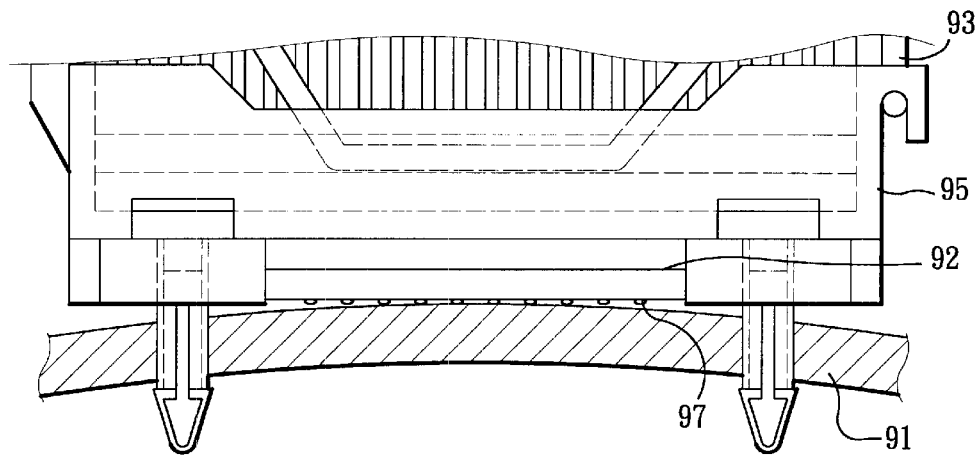
FIG. 3 is a side view illustrating flexure of the motherboard of FIG. 2.
Figure 4:
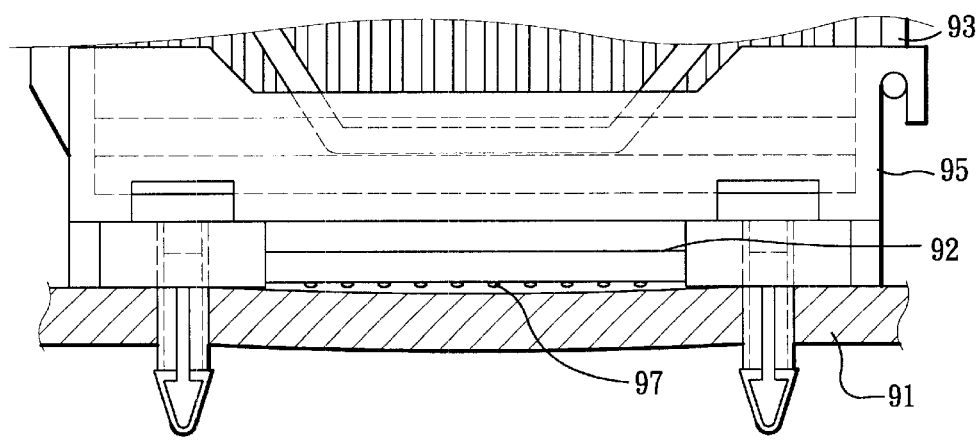
FIG. 4 is another side view illustrating flexure of the motherboard of FIG. 2.
Figure 5:
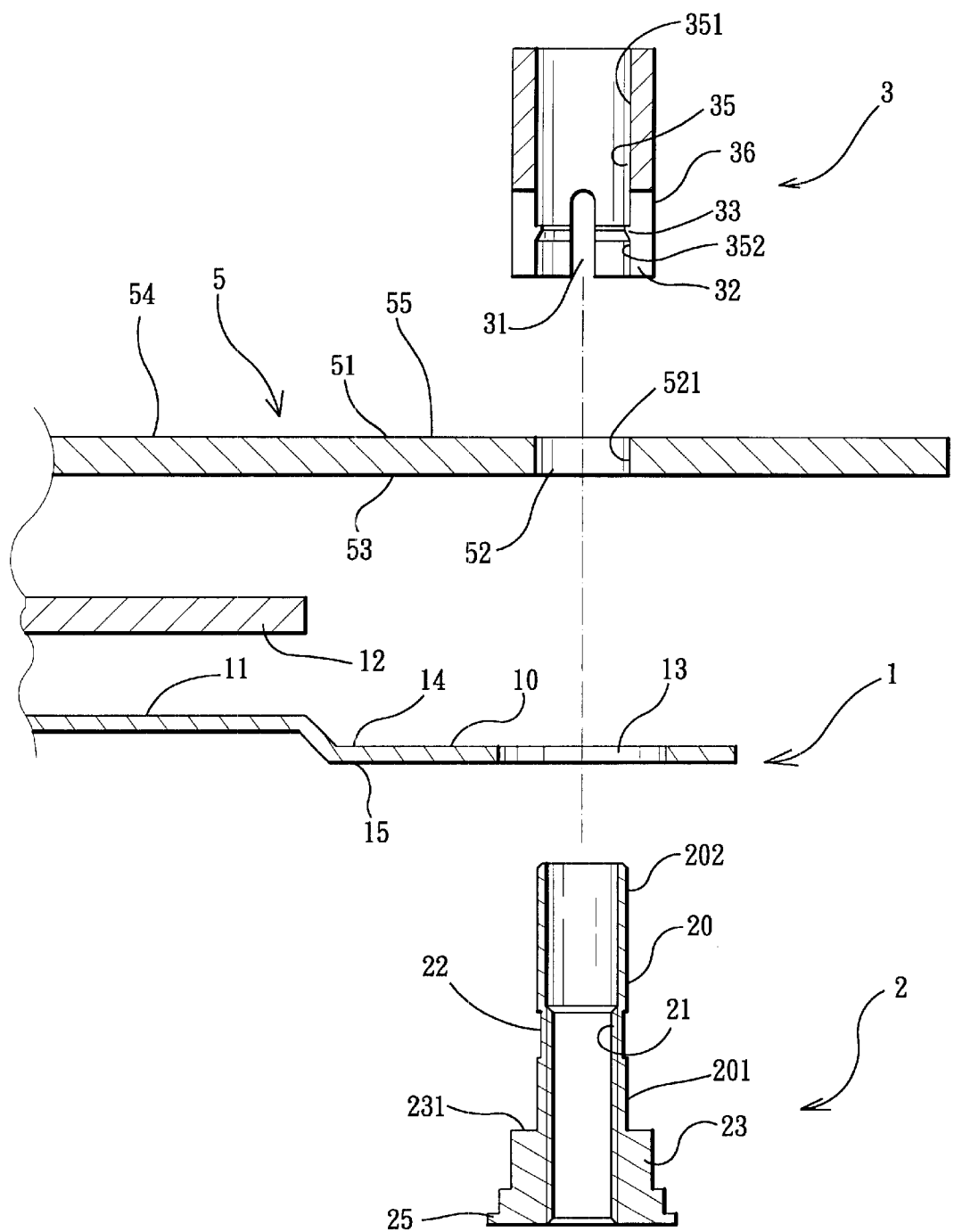
FIG. 5 is an exploded sectional view of a preferred embodiment of an engagement securing device according to the invention in part.
Figure 6:
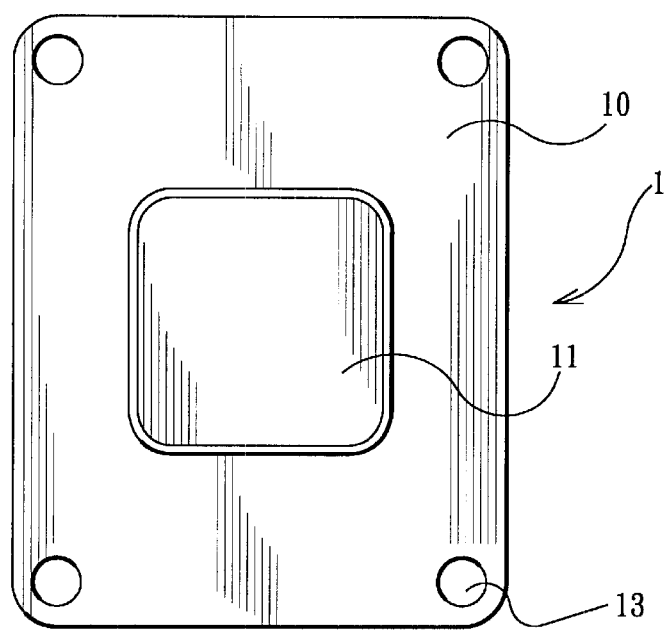
FIG. 6 is a bottom plan view of a support member of the preferred embodiment.

Referring to FIGS. 5 to 8, the preferred embodiment of an engagement securing device according to the present invention helps maintain proper engagement between a motherboard 5 and a central processing unit 6 of a computer. The motherboard 5 has upper and lower sides 51, 53 opposite to each other in an upright direction. The upper side 51 has a mounting portion 54 and a peripheral portion 55 surrounding the mounting portion 54. In this embodiment, the central processing unit 6 is mounted on the mounting portion 54 of the motherboard 5 using the BGA technique. Certainly, the preferred embodiment can also be applied to a computer having the central processing unit 6 mounted on the motherboard 5 in a different fashion or via a mounting socket (e.g., a zero insert force connector). A heat sink 4 is disposed on the central processing unit 6, and is spaced apart from the mounting portion 54 in the upright direction. The heat sink 4 includes a plurality of spaced-apart upwardly extending fins 41, and is supported on the mounting portion 54 via a heat sink mounting member 42, which may be integrally formed with the heat sink 4 to serve as a bottom portion thereof.

As shown, the engagement securing device includes a support member 1, a first spacer member 12, a plurality of first inner peripheral portions 431, a plurality of second inner peripheral portions 521, a plurality of elongate tightening members 2, and a plurality of second spacer members 23.

In this embodiment, the support member 1 is formed from an elastic metal material or any other suitable elastic material, and is configured to be in the form of a substantially rectangular planar plate so as to match the profile of the heat sink 4. As shown, the support member 1 is adapted to be disposed under the motherboard 5, and has upper and lower surfaces 14, 15. The upper surface 14 is adapted to be spaced apart from the lower side 53 in the upright direction, and has a supporting portion 11 corresponding to the mounting portion 54 and with a substantially square-shaped area slightly smaller than that of the central processing unit 6, and a surrounding portion 10 corresponding to the peripheral portion 55. The upper surface 14 is configured so that the surrounding portion 10 is spaced apart from the lower side 53 of the motherboard 5 opposite to the peripheral portion 55 by a first length, and so that the supporting portion 11 is spaced apart from the lower side 53 of the motherboard 5 opposite to the mounting portion 54 by a second length which is shorter than the first length. The surrounding portion 10 defines a plurality of first tightening holes 13, each of which extends downwardly through the lower surface 15. In this embodiment, four first tightening holes 13 are formed in the surrounding portion 10 in the four corners of the support member 1.

The first spacer member 12, which has a size corresponding to that of the supporting portion 11, is disposed on the supporting portion 11 on the upper surface 14 and is adapted to abut against the lower side 53 of the motherboard 5 opposite to the mounting portion 54. Preferably, the first spacer member 12 is made from an electrically insulative material so as to prevent possible direct contact between the metal-formed supporting portion 11 and the lower side 53 of the motherboard 5, which may result in short circuit.

The first inner peripheral portions 431 are adapted to be formed in one of the heat sink 4 and the heat sink mounting member 42. Each of the first inner peripheral portions 431 defines a second tightening hole 43 that is aligned with a respective one of the first tightening holes 13.

The second inner peripheral portions 521 are adapted to be formed in the peripheral portion 55. Each of the second inner peripheral portions 521 defines a third tightening hole 52 that extends through the upper and lower sides 51, 53 of the motherboard 5 and that is aligned with a respective one of the first tightening holes 13 and a respective one of the second tightening holes 43.

The second spacer members 23 are disposed on the upper surface 14 at the surrounding portion 10. Each of the second spacer members 23 is adapted to abut against the lower side 53 around a respective one of the second inner peripheral portions 521 so as to resist displacement of the surrounding portion 10 toward the second inner peripheral portions 521, thereby maintaining the first spacer member 12 between the supporting portion 11 and the mounting portion 54.

Each of the elongate tightening members 2 is configured to pass through a respective one of the third tightening holes 52, and is disposed to bring the surrounding portion 10 to move toward a respective one of the first inner peripheral portions 431 and a respective one of the second inner peripheral portions 521.

Each of the elongate tightening members 2 includes a base portion 25, a tubular post portion 20, and a shank portion 40. The base portion 25 is disposed in a respective one of the first tightening holes 13 and extends downwardly and outwardly of the respective one of the first tightening holes 13, and further extends in a first direction transverse to the upright direction to abut against the lower surface 15 of the support member 1. The post portion 20 extends from the base portion 25 in the upright direction to pass through the first and third tightening holes 13, 52 and to extend beyond the upper side 51 of the motherboard 5. The post portion 20 has an inner threaded wall surface 21 of a certain length extending along an axis parallel to the upright direction. The post portion 20 further includes proximate and distal segments 201, 202 (see FIG. 5) opposite to each other in the upright direction relative to the base portion 25, and an annular abutment neck segment 22 of a certain height interposed between the proximate and distal segments 201, 202 and having an outer diameter smaller than that of the distal segment 202. In this embodiment, each of the second spacer members 23 is disposed to surround and is integrally formed with the respective post portion 20. The shank portion 40 (see FIG. 8) has an outer threaded wall surface 451 extending in the upright direction and threadedly engageable with the inner threaded wall surface 21. The shank portion 40 further includes a lower segment 45 threadedly engageable with the inner threaded wall surface 21, an upper segment 46 extending from the lower segment 45 in the upright direction and rotatably engaged with the respective one of the first inner peripheral portions 431, and an enlarged segment 44 extending from the upper segment 46 upwardly and outwardly of the second tightening hole 43 in the respective one of the first inner peripheral portions 431. The shank portion 40 enables displacement of the surrounding portion 10 toward a respective one of the second inner peripheral portions 521 via threaded engagement between the inner and outer threaded wall surfaces 21, 451. The enlarged segment 44 further extends in the first transverse direction so as to be adapted to abut against one of the heat sink 4 and the heat sink mounting member 42 when the inner and outer threaded wall surfaces 21, 451 are threadedly engaged with each other.

The engagement securing device of the present invention further includes a plurality of third spacer members 3 having a tubular shape. Each of the third spacer members 3 extends along the axis of the inner threaded wall surface 21 of the post portion 20 of a respective one of the elongate tightening members 2, and has inner and outer surrounding wall surfaces 35, 36 opposite to each other in radial directions relative to the axis. The inner surrounding wall surface 35 has upper and lower segments 351, 352 opposite to each other in the upright direction. The lower segment 352 has a plurality of radially extending slits 31 communicating with the outer surrounding wall surface 36 and extending toward the upper segment 351 in the upright direction. In this embodiment, the slits 31 are displaced from each other by an angle of approximately 90 degrees, thereby forming four flaps 32. As such, when a respective one of the third spacer members 3 is sleeved on the distal segment 202 of the corresponding post portion 20, the lower segment 352 will be forced outwardly and radially against an inherent biasing action thereof until the lower segment 352 reaches the abutment neck segment 22. Furthermore, each of the third spacer members 3 includes a plurality of engaging protrusions 33 angularly displaced from one another about the axis. Each of the engaging protrusions 33 is disposed on the lower segment 352 at a substantially intermediate part of a respective one of the flaps 32, and extends from the inner surrounding wall surface 35 inwardly and radially such that when the lower segment 352 reaches the abutment neck segment 22 of the respective post portion 20, the engaging protrusions 33 will be brought by the inherent biasing action to engage the abutment neck segment 22 of the respective post portion 20. In this embodiment, each of the engaging protrusions 33 has a longitudinal section resembling a trapezium having a bottom side 331 oriented outwardly and a slanting side 332 oriented downwardly. The height of each of the engaging protrusions 33, i.e., length of the bottom side 331 of the trapezium, is slightly less than the height of the abutment neck segment 22 so as to be able to displace upwardly and downwardly about the abutment neck segment 22 for tightness adjustment purposes. In addition, each of the third spacer members 3 is adapted to abut against the upper side 51 of the motherboard 5 and one of the heat sink 4 and the heat sink mounting member 42 at two positions which are respectively adjacent to the upper and lower segments 351, 352.

Figure 7:
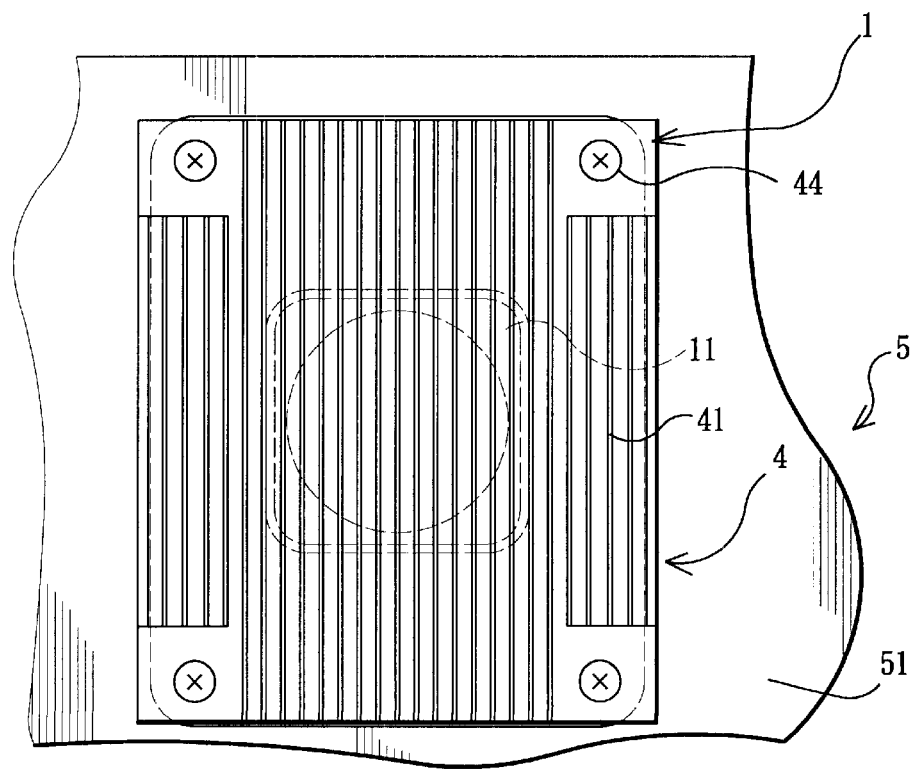
FIG. 7 is a top plan view of the preferred embodiment in an assembled state.
Figure 8:
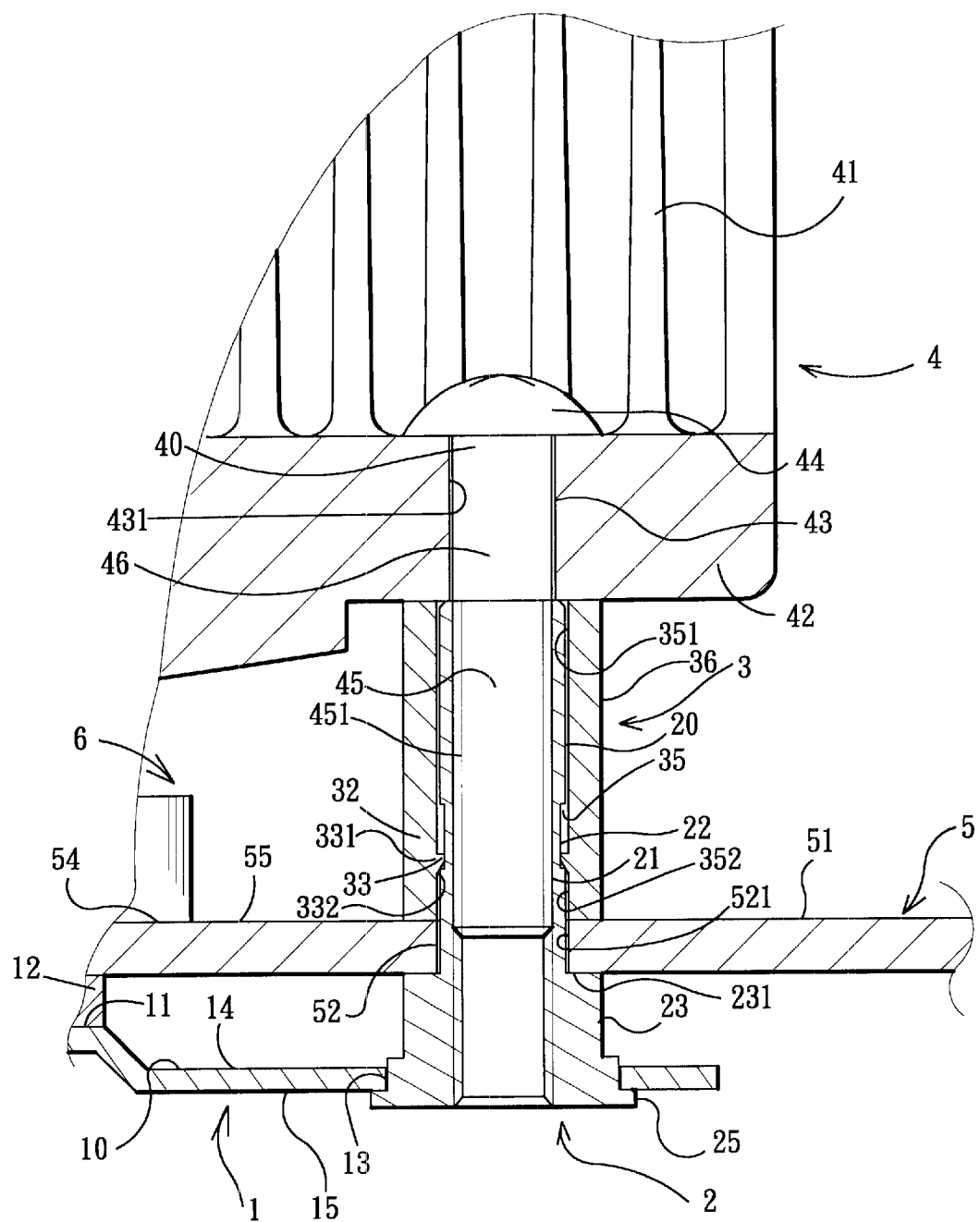
FIG. 8 is a fragmentary partly sectional view of the preferred embodiment in a state of use.

With further reference to FIGS. 7 and 8, during assembly, the first spacer member 12 and the support member 1 are sequentially disposed on the lower side 53 of the motherboard 5 such that the first tightening holes 13 in the support member 1 are aligned with the third tightening holes 52 in the motherboard 5. Then, the post portions 20 are extended respectively through the corresponding first and third tightening holes 13, 52 such that the base portions 25 abut against the lower surface 15 of the support member 1. Thereafter, the third spacer members 3 are respectively fitted on the post portions 20 which extend upwardly from the upper side 51 of the motherboard 5. During the process of fitting each third spacer member 3 on the respective post portion 20, the flaps 32 thereof will flex slightly outward due to contact between the engaging protrusions 33 thereof and the respective post portion 20 until the engaging protrusions 33 displace to the abutment neck segment 22, thereby retaining the motherboard 5 on the support member 1.

Subsequently, the heat sink 4 is disposed on the central processing unit 6, with the second tightening holes 43 respectively aligning with the third tightening holes 52 in the motherboard 5. Each of the shank portions 40 is extended through the corresponding second and third tightening holes 43, 52 such that the outer threaded wall surface 451 thereof engages the corresponding inner threaded wall surface 21. During the downward extension of each shank portion 40, the respective post portion 20 will displace slightly upwardly relative thereto so that the corresponding second spacer member 23 has an upper side 231 abutting tightly against the lower side 53 of the motherboard 5 around the respective second inner peripheral portion 521. Hence, the third spacer members 3 can be maintained between the heat sink 4 or the heat sink mounting member 42 and the motherboard 5 to enable the heat sink 4 to be secured firmly on the motherboard 5.

In the present invention, by virtue of the engaging protrusions 33 of the third spacer members 3 that engage the abutment neck segments 22 of the post portions 20, the relative positions of the third spacer members 3 and the post portions 20 are adjustable during assembly so that the heat sink 4 together with the central processing unit 6 can be rigidly and firmly secured on the upper side 51 of the motherboard 5. In addition, the support member 1 that is secured to the lower side 53 of the motherboard 5 by the elongate tightening members 2 disposed in the surrounding portion 10 provides a pressure on the lower side 53 of the motherboard 5 opposite to the heat sink 4, which enables the motherboard 5, the central processing unit 6 and the heat sink 4 to be coupled rigidly. Thus, the motherboard 5 can be stabilized and prevented from flexing.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. An engagement securing device to help maintain proper engagement between a motherboard and a central processing unit of a computer, the motherboard having upper and lower sides opposite to each other in an upright direction, the upper side having a mounting portion and a peripheral portion surrounding the mounting portion, the central processing unit being mounted on the mounting portion;

the computer further including a heat sink disposed on the central processing unit and spaced apart from the mounting portion in the upright direction, and a heat sink mounting member disposed to support the heat sink on the mounting portion, said engagement securing device comprising:

a support member adapted to be disposed under the motherboard, and having upper and lower surfaces, said upper surface being adapted to be spaced apart from the lower side of the motherboard in the upright direction and having a supporting portion corresponding to the mounting portion, and a surrounding portion corresponding to the peripheral portion, said upper surface being configured so that said surrounding portion is spaced apart from the lower side of the motherboard by a first length, and so that said supporting portion is spaced apart from the lower side of the motherboard by a second length which is shorter than said first length, said surrounding portion defining a plurality of first tightening holes, each of which extends downwardly through said lower surface;

a first spacer member disposed on said supporting portion on said upper surface and adapted to abut against the lower side of the motherboard;

a plurality of first inner peripheral portions adapted to be formed in one of the heat sink and the heat sink mounting member, each of said first inner peripheral portions defining a second tightening hole that is aligned with a respective one of said first tightening holes;

a plurality of second inner peripheral portions adapted to be formed in the peripheral portion, each of said second inner peripheral portions defining a third tightening hole that extends through the upper and lower sides of the motherboard;

a plurality of elongate tightening members, each of which is configured to pass through a respective one of said third tightening holes, and is disposed to bring said surrounding portion to move toward a respective one of said first inner peripheral portions and a respective one of said second inner peripheral portions; and a plurality of second spacer members disposed on said upper surface at said surrounding portion, each of said second spacer members being adapted to abut against the lower side of the motherboard around a respective one of said second inner peripheral portions so as to resist displacement of said surrounding portion toward said second inner peripheral portions, thereby maintaining said first spacer member between said supporting portion and the mounting portion.

2. An engagement securing device according to claim 1, wherein each of said elongate tightening members includes:

a base portion disposed in a respective one of said first tightening holes, said base portion extending downwardly and outwardly of the respective one of said first tightening holes and further extending in a first direction transverse to the upright direction to abut against said lower surface of said support member;

a tubular post portion extending from said base portion in the upright direction to pass through said first and third tightening holes and to extend beyond the upper side of the motherboard, said post portion having an inner threaded wall surface extending along an axis parallel to the upright direction; and a shank portion having an outer threaded wall surface extending in the upright direction and threadedly engageable with said inner threaded wall surface.

3. An engagement securing device according to claim 2, wherein said shank portion includes a lower segment threadedly engageable with said inner threaded wall surface, and an upper segment extending from said lower segment in the upright direction and rotatably engaged with the respective one of said first inner peripheral portions.

4. An engagement securing device according to claim 3, wherein said shank portion includes an enlarged segment which extends from said upper segment upwardly and outwardly of said second tightening hole in the respective one of said first inner peripheral portions, and which further extends in the first transverse direction so as to be adapted to abut against said one of the heat sink and the heat sink mounting member when said inner and outer threaded wall surfaces are threadedly engaged with each other.

5. An engagement securing device according to claim 4, wherein each of said second spacer members is disposed to surround and is integrally formed with said post portion of a respective one of said elongate tightening members.

6. An engagement securing device according to claim 2, wherein said post portion of each of said elongate tightening members includes proximate and distal segments opposite to each other in the upright direction relative to said base portion, and an abutment neck segment interposed between said proximate and distal segments, said abutment neck segment having an outer diameter smaller than that of said distal segment, said engagement securing device further comprising a plurality of third spacer members having a tubular shape, each of said third spacer members extending along the axis of said inner threaded wall surface of said post portion of a respective one of said elongate tightening members and having inner and outer surrounding wall surfaces opposite to each other in radial directions relative to the axis, said inner surrounding wall surface having upper and lower segments opposite to each other in the upright direction, said lower segment having a plurality of radially extending slits communicating with said outer surrounding wall surface and extending toward said upper segment in the upright direction such that when a respective one of said third spacer members is sleeved on said distal segment, said lower segment will be forced outwardly and radially against an inherent biasing action thereof until said lower segment reaches said abutment neck segment.

7. An engagement securing device according to claim 6, wherein each of said third spacer members includes a plurality of engaging protrusions angularly displaced from one another about the axis, each of which is disposed on said lower segment and extends from said inner surrounding wall surface inwardly and radially such that when said lower segment reaches said abutment neck segment, said engaging protrusions will be brought by the inherent biasing action to engage in said abutment neck segment.

8. An engagement securing device according to claim 7, wherein each of said third spacer members is adapted to abut against the upper side and said one of the heat sink and the heat sink mounting member at two positions which are respectively adjacent to said upper and lower segments.

9. An engagement securing device according to claim 1, wherein said first spacer member is made from an electrically insulative material.

* * * * *